United States Patent [19]

Evans

[11] 3,985,413

[45] Oct. 12, 1976

[54] MINIATURE ELECTRICAL CONNECTOR

[75] Inventor: William Robert Evans, Clemmons, N.C.

[73] Assignee: AMP Incorporated, Harrisburg, Pa.

[22] Filed: Sept. 6, 1974

[21] Appl. No.: 503,884

Related U.S. Application Data

[63] Continuation-in-part of Ser. No. 419,004, Nov. 26, 1973, abandoned.

[52] U.S. Cl. .......................... 339/17 LM; 339/61 M

[51] Int. Cl.² .......................................... H05K 1/07

[58] Field of Search .......... 339/17 R, 17 M, 17 LM, 339/59–61, 75 MP, 176 MF; 317/101 F; 156/54

[56] References Cited

UNITED STATES PATENTS

| | | | |
|---|---|---|---|
| 2,980,874 | 4/1961 | Tarbox | 339/17 F X |
| 3,206,541 | 9/1965 | Jachimowicz | 156/54 X |
| 3,278,887 | 10/1966 | Travis | 339/176 MF |
| 3,333,229 | 7/1967 | Dean et al. | 339/176 MF X |
| 3,414,867 | 12/1968 | Travis | 339/176 MF X |
| 3,638,163 | 1/1972 | Loosme | 339/17 M |
| 3,795,884 | 3/1974 | Kotaka | 339/17 LM |
| 3,851,297 | 11/1974 | Munro | 339/61 M |
| 3,858,958 | 1/1975 | Davies | 339/59 M X |

*Primary Examiner*—Joseph H. McGlynn
*Assistant Examiner*—Craig R. Feinberg
*Attorney, Agent, or Firm*—F. W. Raring; R. W. Pitts; Jay L. Seitchik

[57] ABSTRACT

Miniature electrical connector for forming connections between conductors on parallel spaced apart substrates comprises a generally cylindrical elastomeric body having a thin non-yielding flexible circuit wrapped therearound. The circuit has parallel spaced apart conductors on its surface so that when the connector is positioned between the two parallel substrates and compressed between the substrates, the corresponding conductors on the substrates will be electrically connected by the conductors on the flexible circuit. The flexible circuit is not firmly bonded to the elastomeric body and the body is not significantly deformed when compressed between the substrates. The flexible circuit, being non-yielding is not deformed laterally so that alignment of conductors on the circuit with conductors on the substrate is maintained.

5 Claims, 21 Drawing Figures

30
32
34
36
38
40
42
44
54
56
58
66
68
70
72
74
76
78

Fig. 18
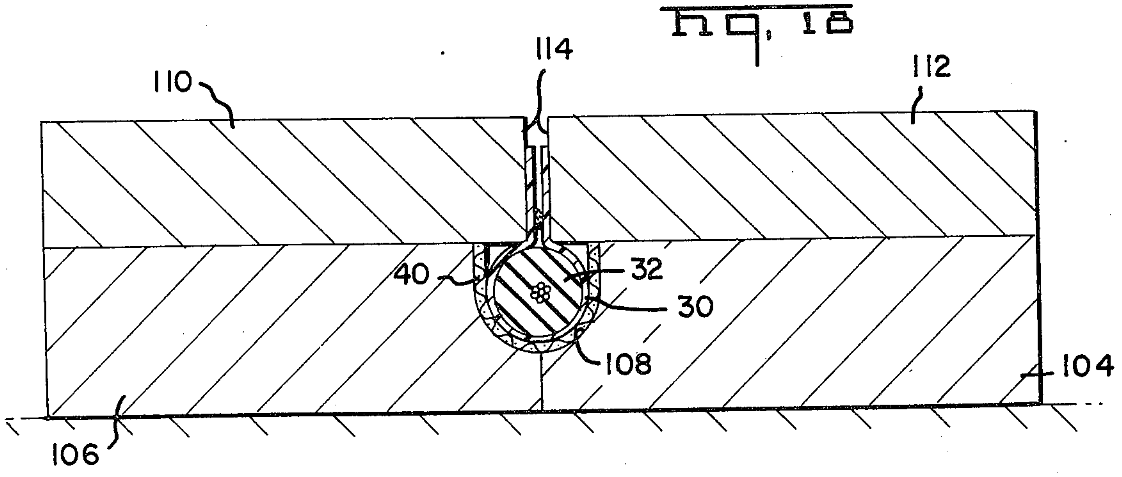
Fig. 19
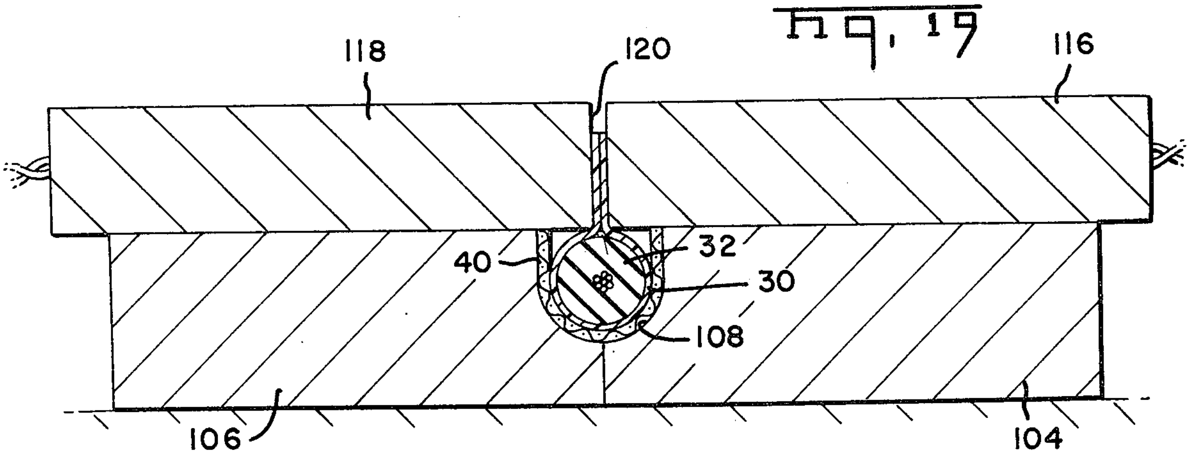
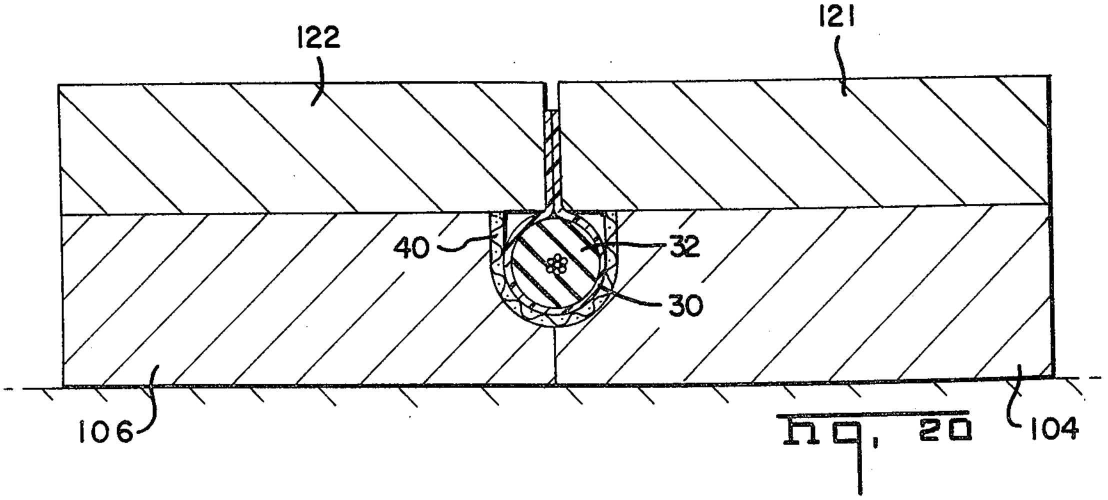
Fig. 20

MINIATURE ELECTRICAL CONNECTOR

This application is a continuation-in-part of application Ser. No. 419,004 filed Nov. 26, 1973 now abandoned.

BACKGROUND OF THE INVENTION

The increasing use of solid state devices and solid state circuitry in electronic devices such as pocket calculators, digital electronic watches, small meters and similar products has given rise to a need for an extremely small electrical connector for forming connections between small parallel substrates such as the circuit board and the L.E.D. (light emitting diode) or liquid crystal unit of a watch. It is possible to obtain an insight into the dimensional requirements which must be met if one contemplates the dimensions of an ordinary wrist watch and reflects that the connector must fit between two parallel planes in the watch casing (the L.E.D. and the circuit board or substrate) and that as many as fifteen or twenty aligned terminal pads on the circuit substrate must be connected to a like number of terminal areas on the L.E.D. Conventional connector technology for making such substrate-to-substrate connections does not provide practical solutions to the problem. When the substrates are of the size of a printed circuit board of a few years ago, a conventional edge connector can simply be assembled to each board or substrate with wires extending between the sheet metal contact terminals in the housings of the connectors but it is impractical to scale down a conventional edge connector having a plastic housing and sheet metal terminals therein to the extent that two such connectors each having fifteen or so terminals therein could be fitted in the housing of an ordinary wrist watch.

The instant invention is accordingly directed to the problem of providing an extremely small connector which can, in the space available between two substrates contained in a wrist watch, function to electrically connect a substantial number of conductors on the opposed surfaces of the substrates. The invention is further directed to the provision of a connector having these capabilities and lying within the dimensional limitations discussed above which can, as a practical matter, be manufactured at a relatively low cost by a relatively simple and reliable assembly process.

It is accordingly an object of the invention to provide an improved subminiature electrical connector. A further object is to provide a subminiature electrical connector which can be manufactured at a low cost and which will serve reliably for an extended time period in subminiature circuit devices. A further object is to provide a versatile connector which can be used in a wide variety of extremely small electronic devices so that a standard connecting device can be used under many circumstances for different specific applications.

These and other objects of the invention are achieved in preferred embodiments thereof, which are briefly described in the foregoing abstract, which are described in detail below, and which are shown in the accompanying drawing in which.

Figure 2:
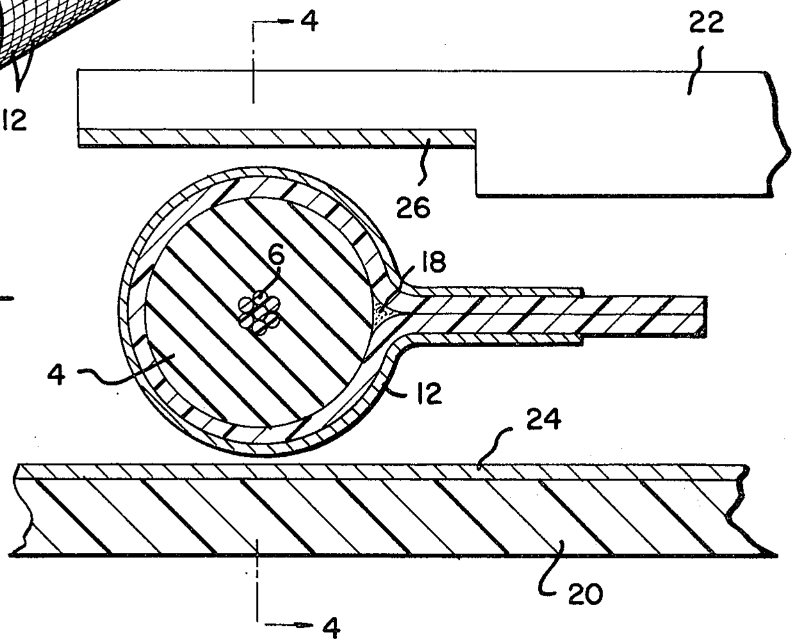
FIG. 2 is a fragmentary end view of the connector of FIG. 1 positioned between two substrates, this view showing the positions of the parts prior to assembly of the substrates in the connector.
Figure 3:
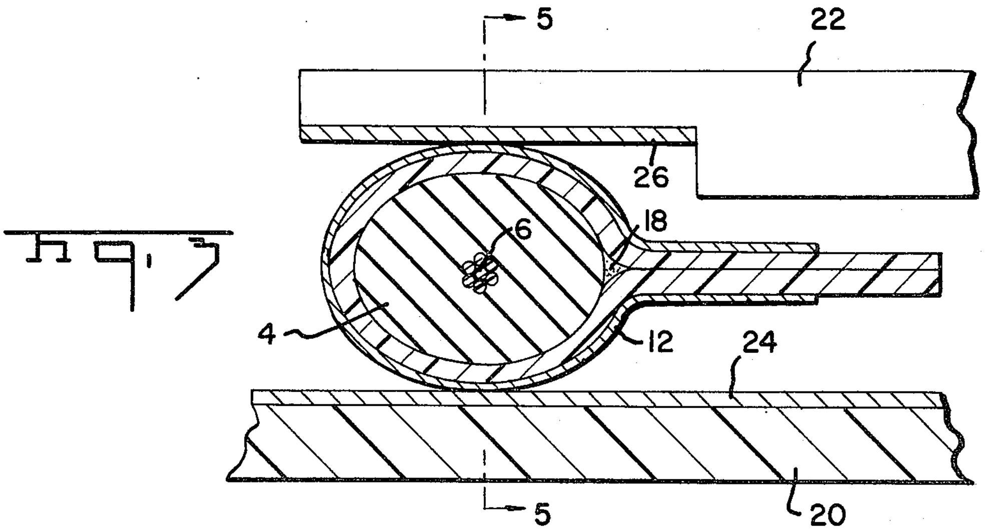
FIG. 3 is a view similar to FIG. 2 but showing the parts in assembled relationship.
Figure 4:
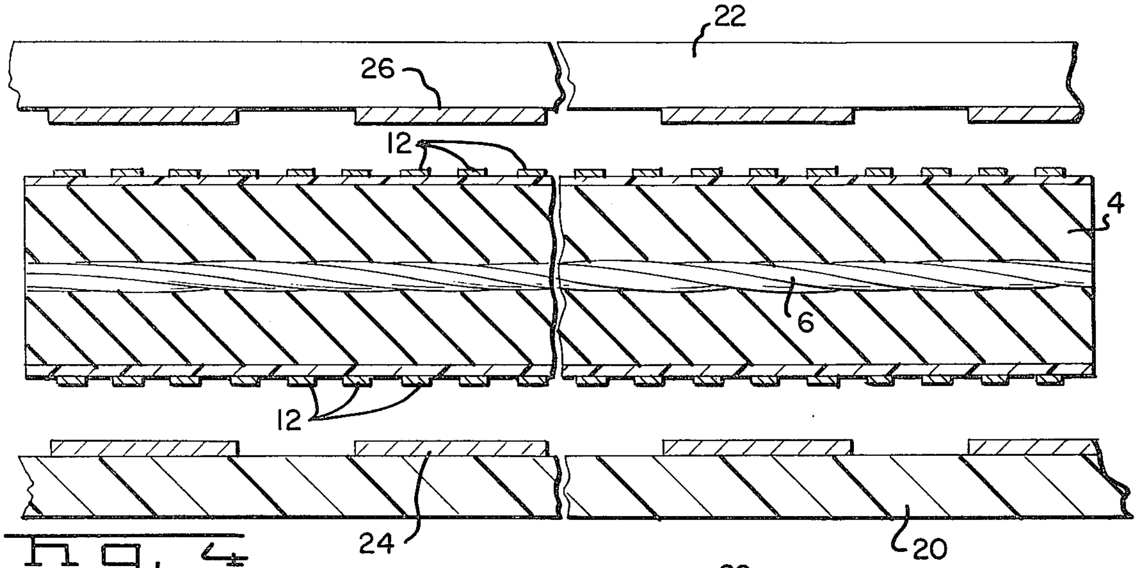
Figure 5:
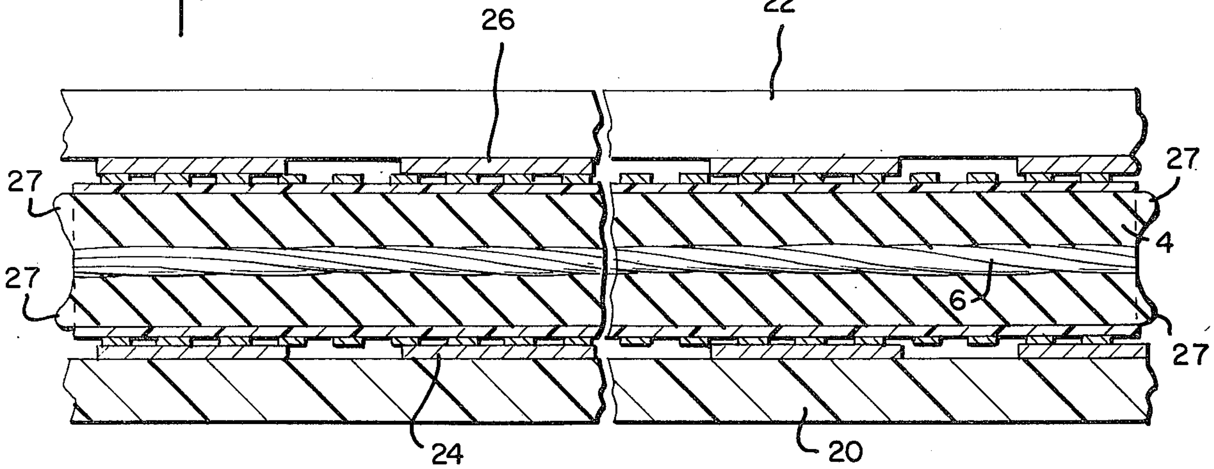

FIGS. 4 and 5 are views taken along the lines 4—4 and 5—5 of FIGS. 2 and 3 respectively.

Figure 6:
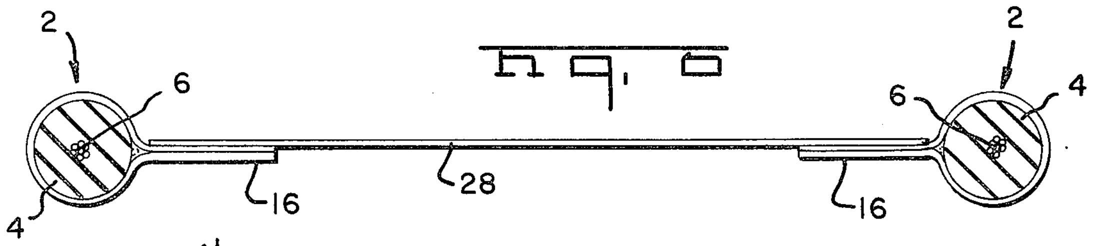
Figure 7:
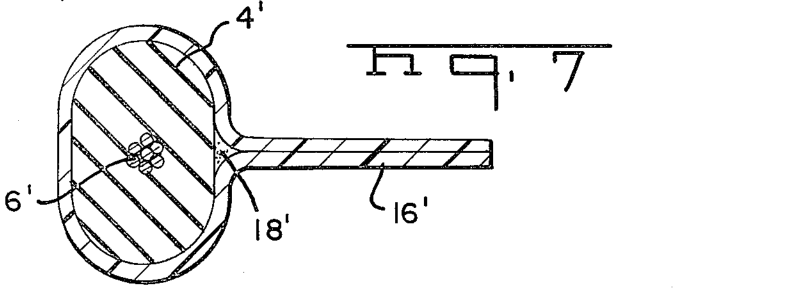
Figure 6:
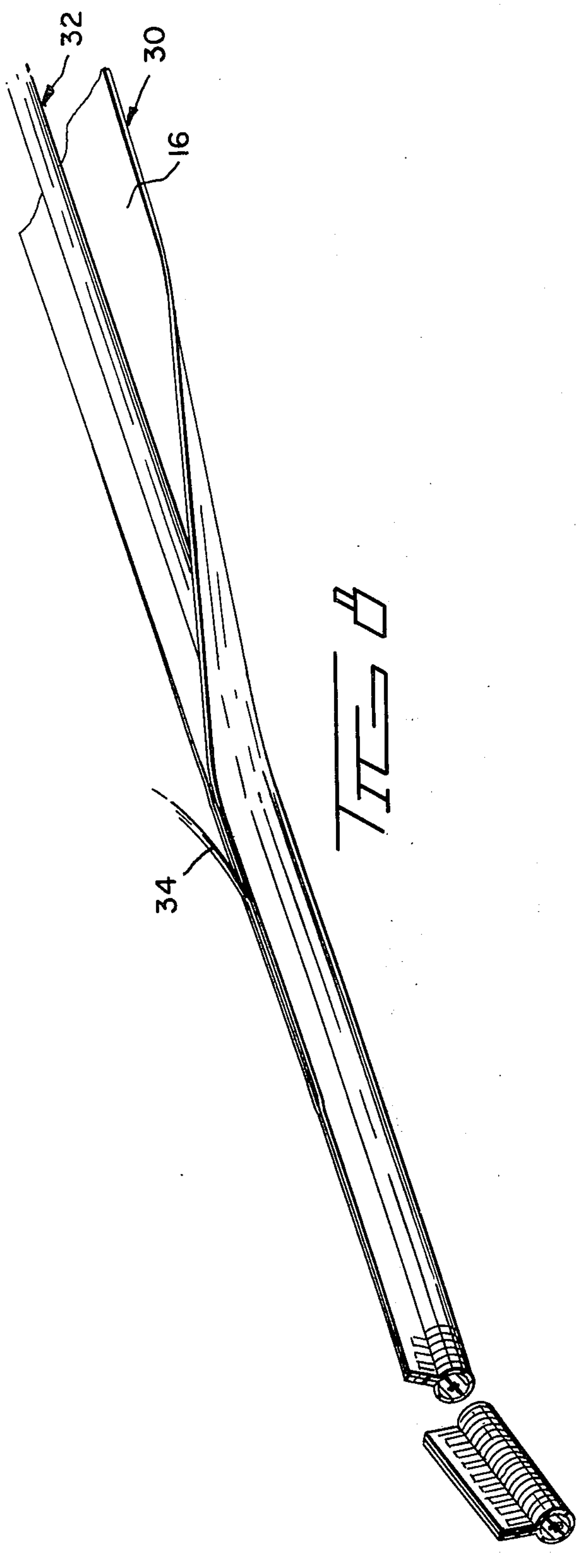

FIGS. 6 and 7 are end views of alternative embodiments of the invention.

Figure 1:
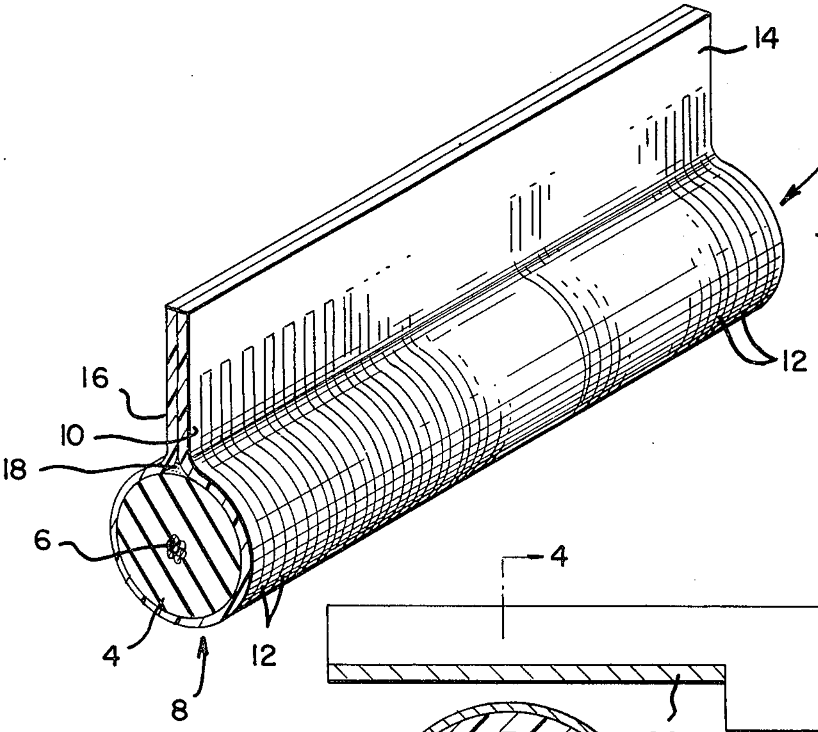
FIG. 1 is a perspective view of a preferred form of electrical connector in accordance with the invention.

FIG. 8 is a perspective view illustrating a preferred manufacturing technique for producing the connector shown in FIG. 1.

Figure 10:
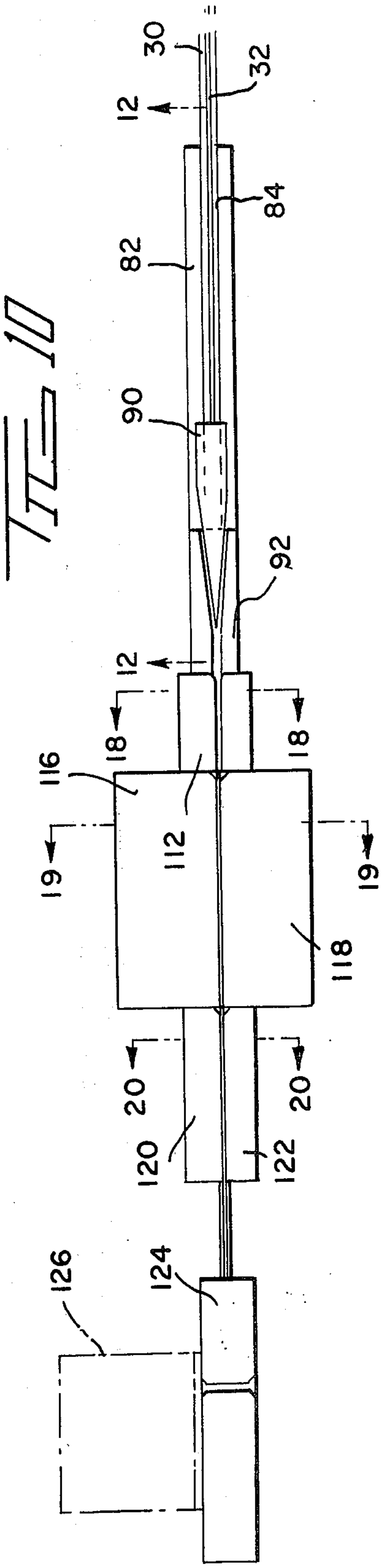
Figure 9A:
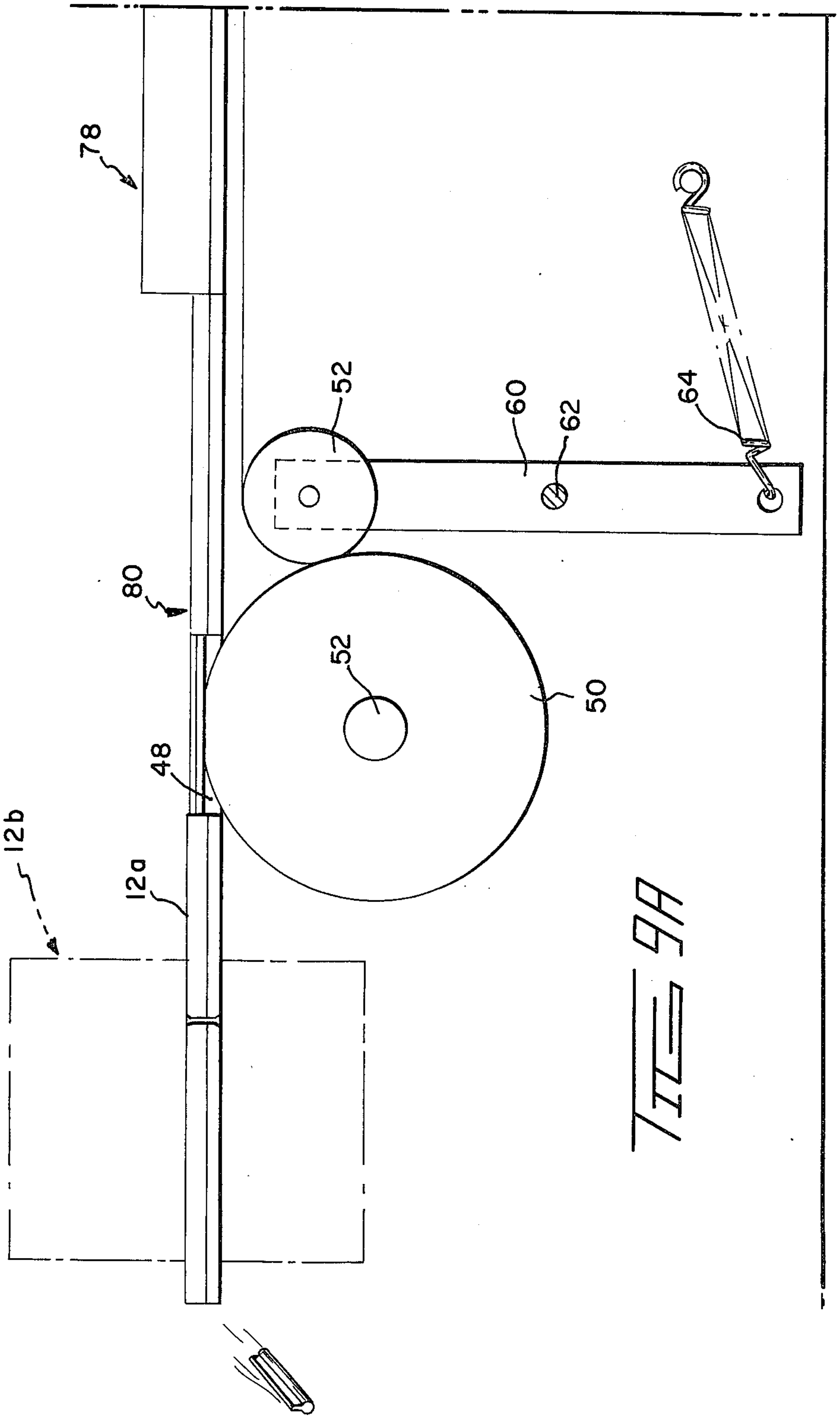
Figure 9B:
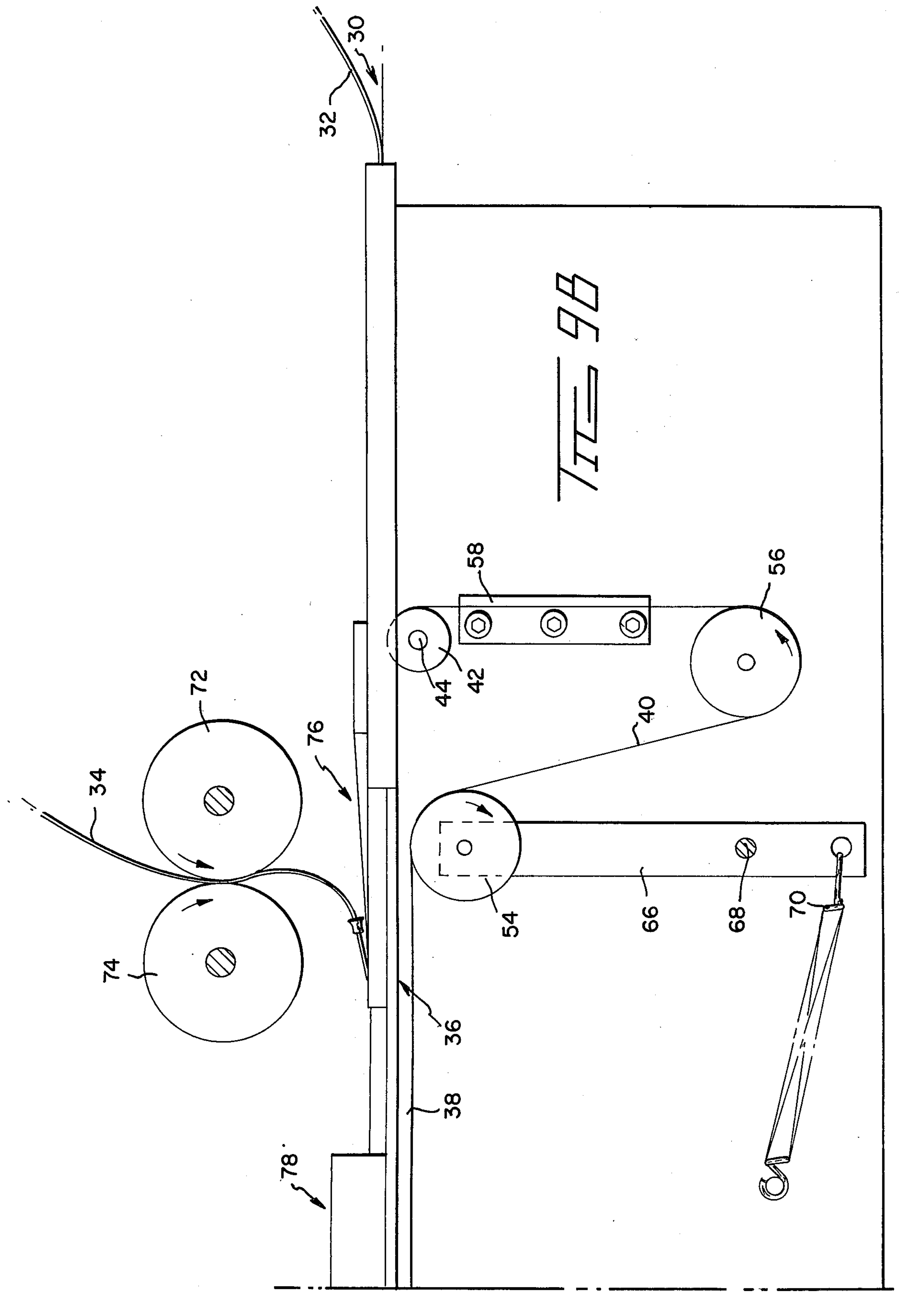

FIGS. 9A and 9B are frontal views of an apparatus for producing connectors in accordance with the embodiment of FIG. 1 by the method illustrated in FIG. 8, these views being so constructed that they can be placed beside each other to provide an overall view of the apparatus. FIG. 10 is a top plan view of the apparatus of FIGS. 9A and 9B.

Figure 11:
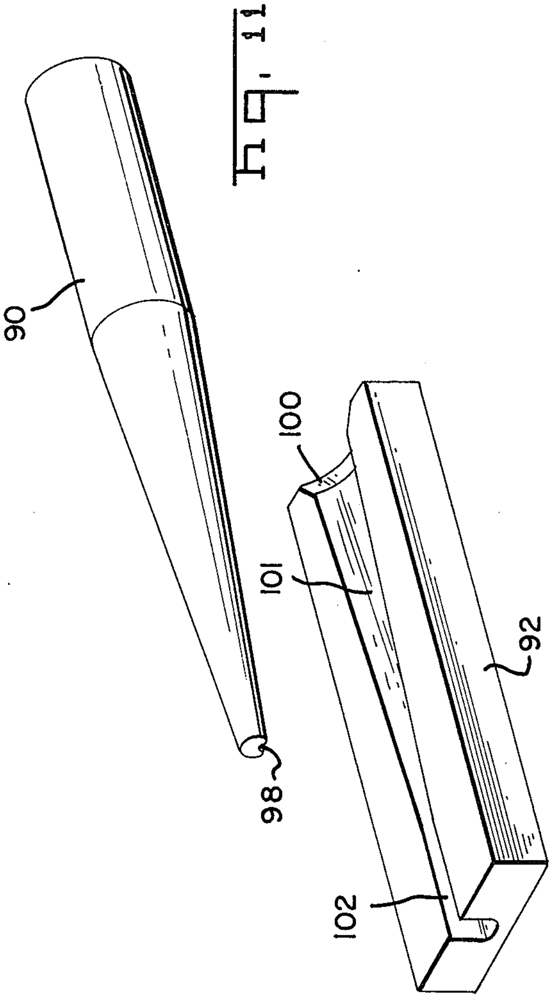

FIG. 11 is a perspective exploded view of a forming die and mandrel which form part of the apparatus of FIGS. 9A and 9B.

Figure 12:
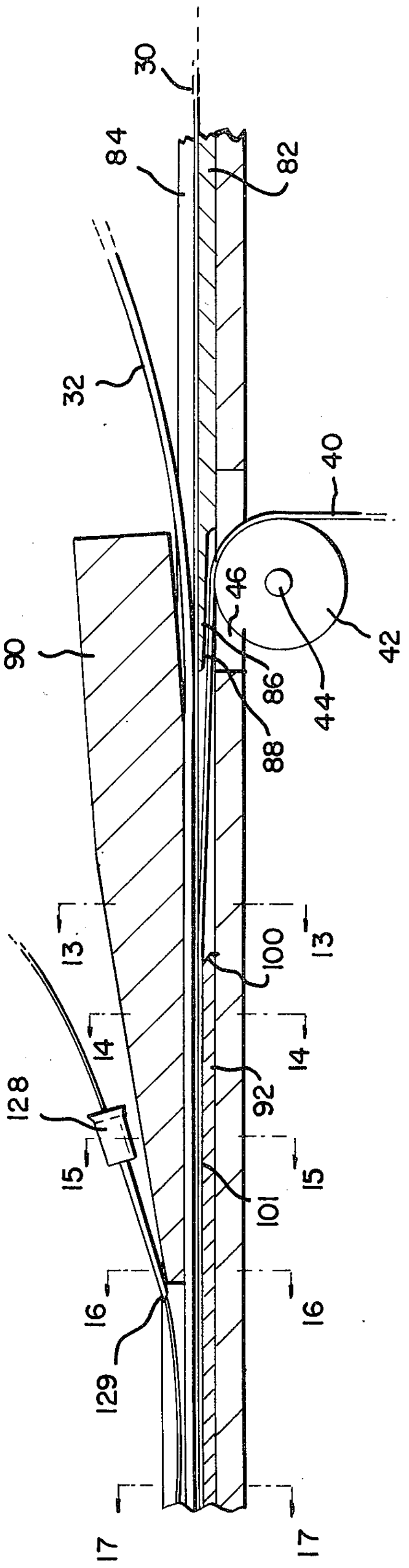

FIG. 12 is a sectional view of the righthand portion of the apparatus of FIGS. 9A and 9B showing the portions thereof which function to guide a continuous web of flexible circuitry, a continuous length of elastomer, and a continuous strand of bonding material into assembled relationship.

FIGS. 13, 14, 15, 16, and 17 are views taken along the section lines having the same numbers in FIG. 12.

FIGS. 18, 19 and 20 are views taken along the section lines in FIG. 10 having the same numbers.

Referring first to FIG. 1, a preferred form of connector 2 in accordance with the invention comprises a cylindrical elastomeric body 4 which may have a center core 6 of fiber glass or metal strands on which a flexible circuit generally indicated at 8 is wrapped. The flexible circuit 8 comprises a thin film 10 of polymeric material which, as will be explained below, should be flexible so that it can be wrapped around the body 4 but which is non-yielding, i.e. which will not elongate significantly when stressed in a tensile mode. The film has a plurality of parallel relatively narrow conductors 12 on its external surface and the developed width of the film as viewed in FIG. 1 is significantly greater than the circumference of the body 4. The marginal side portions 14 of the film are against each other and extend radially with respect to the body 4 to form a tab 16. As will be explained below, the opposed surfaces of these marginal side portions are bonded to each other by bonding material 18 which is fused to the surfaces and the marginal side portions. It should also be noted that the conductors 12 are of uniform length and have their ends in alignment. These ends do not extend to the side edges of the film (the free end of the tab 16) so that there is a bend of film adjacent to the free end of the tab which is devoid of conductors.

A connector of the type shown in FIG. 1 can be used to form electrical connections between conductors 24 on a substrate 20 and opposed conductors 26 on a substrate 22. The substrate 20 may, for example, be the circuit substrate of a digital watch and the substrate 22 may be the L.E.D. package for the watch. The connector is placed between the conductors 26 and the conductors 24 as shown in FIG. 2 and the substrates 20, 22 are moved to the positions of FIG. 3. In a device such as a watch, they will be retained in these positions by clamping means which are not specifically shown.

As is apparent from FIG. 3, the elastomeric body 4 is significantly compressed between the substrates 20, 22 until it has a generally oval cross-section and its tendency to return to its normal position will impose a substantial contact pressure on the conductors 12 and maintain them in intimate electrical contact with the conductors 24, 26.

As explained previously, the flexible circuit 8 is not securely bonded to the surface of the elastomeric body 4 and it is moreover non-yielding. As shown in FIG. 5, the elastomeric body can thus elongate at its ends as shown at 27 and the surface of the body 4 will move relative to the inner-surface of the flexible circuit which, because of its inability to yield will remain stationery. It will be noted from FIGS. 4 and 5 that the core 6 does not elongate under the influence of the compressive forces imposed by the substrates and the elongation of the elastomeric material is greatest near the outer periphery of the body. As will be explained below, suitable material for the practice of the invention advantageously has a strong core 6 for reasons related to the manufacture of the connector.

It will be noted that the conductors 12 are relatively narrow as compared to the aligned conductors and terminal pads 24, 26 and that several conductors 12 connect each opposed pair of conductors and pads for terminal areas 24, 26.

FIG. 6 shows an alternative embodiment of the invention in which two spaced apart connectors 2 are joined to each other by means of a section of tape 28 which is bonded to the surfaces of the tabs 16 of the connectors. A connector of this type is useful under circumstances where the L.E.D. 22 has terminal areas 26 along two opposite sides thereof which must be connected to conductors on the substrate 20. Under some circumstances, it may prove desirable to form the assembly of FIG. 6 of one sheet of plastic film having irregular conductors on its center portion for the accomodation of the various circuit components such as the integrated circuits, diodes, condensers, etc. In such an arrangement, the conductors would extend to the side edges and the marginal side edge portions of this single circuit would be wrapped around elastomeric bodies 4 in the manner described above.

FIG. 7 shows an embodiment in which the elastomeric body 4' is generally oval shaped with the tab 16' in alignment with the minor axis of the body. Under some circumstances, a higher reserve of contact pressure can be achieved than can be achieved in the embodiment of FIG. 1 since the body 4' would be compressed to a substantially greater extent than would the body 4 between the substrates 20, 22'.

Connectors in accordance with the invention can be made of any practical and desired size within limits although many of the advantages of the connector are realized to the fullest in extremely small devices as will be described below. A variety of materials might be used which are presently available and materials which may become available in the future may have properties which will render them useful for the manufacture of connectors in accordance with the invention. A detailed description as presented immediately below of a specific connecting device in accordance with the invention will provide specific guide lines for the selection of materials for devices in accordance with the invention.

One size connector which has been produced in quanity and successfully used in small circuit devices comprises an elastomeric body having a diameter of about 0.06 inch and a length of about 0.9 inch. A suitable material which was used in the manufacture of the embodiment under consideration is a silicone rubber composition having a Shore A hardness of about 53 and a maximum compression set at a temperature of 212° F of 10% under a load of 64 psi. The compression set is an important property in that materials which will take a set under a relatively low load and/or at a temperature not greatly in excess of ambient temperatures and lose its ability to maintain the contact pressure of the conductors on the connector with the external conductors. The material used had a fibre-glass core as shown in the drawing and as described above which was bonded in the manufacture process to the silicone rubber material. This core prevents a continuous length of the silicone rubber from elongating when it is radially compressed, a characteristic which is important to the manufacture of connectors in accordance with the invention as will be described below. The core does not prevent the deformation of the body illustrated at 27 in FIG. 5 when the connector is put to use and placed or compressed between the substrates 20, 22. The deformation illustrated in FIGS. 4 and 5 is a natural consequence of the compression of the elastic body but the flexible circuit is not elongated since it is not bonded to the elastomer body. The flexible circuit for the connector under consideration was manufactured with a polyimid-amide film having a thickness of about 0.001 inch and the thin copper conductors were plated with about 0.00005 inch of gold over about 0.00017 inch of nickel. Polyimide-amide films are highly desirable in the practice of the invention for the reason that they will not readily yield or elongate under the influence of a compressive load so that the conductors on the surface of the film will not be displaced laterally as viewed in FIG. 5 when the connector is clamped between the substrates. An extremely thin film is advantageous in order to permit the film to be wrapped around the relatively small radius (0.03 inch) of the connector body without fracture. The thin film moreover can be deformed from a circular to an oval cross-section as shown by FIGS. 2 and 3 without fracture.

The bonding material is preferably a polyamid type and is preferably supplied in the form of an extremely fine continuous filament which is used in the manufacturing process and apparatus described below. A particular material which may used in USM 5153 which is supplied by the United Shoe Machinery Company of Beverly, Mass.

When connectors are substantially larger than the one described above are being produced for example, a connector having a diameter of 0.25 inch and a length of 3 or more inches are manufactured, relatively thicker films can be used although the principles as discussed above should be followed.

A preferred method of manufacturing connectors in accordance with the invention as shown in FIG. 8 is to feed a continuous strip or web 30 of the film, i.e. the flexible circuit material, towards an assembly zone and to simultaneously feed a continuous length 32 of silicone rubber body material, the flexible circuit material having the conductors on the downwardly facing surface on the left as viewed in FIG. 8. The flexible circuit material is guided into surrounding relationship with the body material until the side edges of the circuit material and against each other and the center portion of the circuit is wrapped around the body material. A continuous strand 34 of the bonding material is fed into the gap between the opposed surfaces of the film and the opposed surfaces are bonded to each other by applying heat to the outwardly facing surfaces of the circuit material a film. The application of heat causes melting of the bonding material 34 and bonding of the surfaces against each other. After cooling, the connectors are cut from the end of the film and body material as illustrated.

The process illustrated in FIG. 8 should be carried out in a manner such that the body 32 material does not elongate during the forming and heating steps since if it were to be stretched, it would relax at the time of cutting and at length of the elastomer body would be less then the length of the flexible circuit. The presence of the fiber glass core 6 and the fact that this core is bonded to the elastomer prevents such elongation notwithstanding the fact that the silicone rubber is highly resilient and is radially compressed to some extent during the process.

Figure 13:
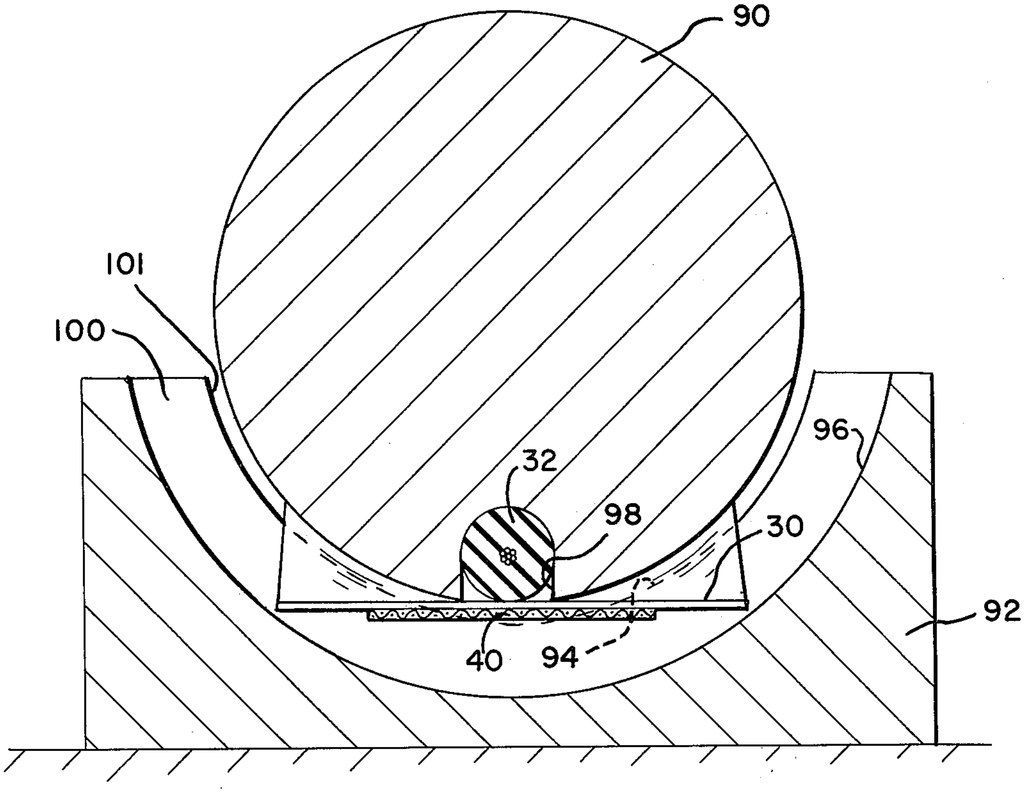
Figure 14:
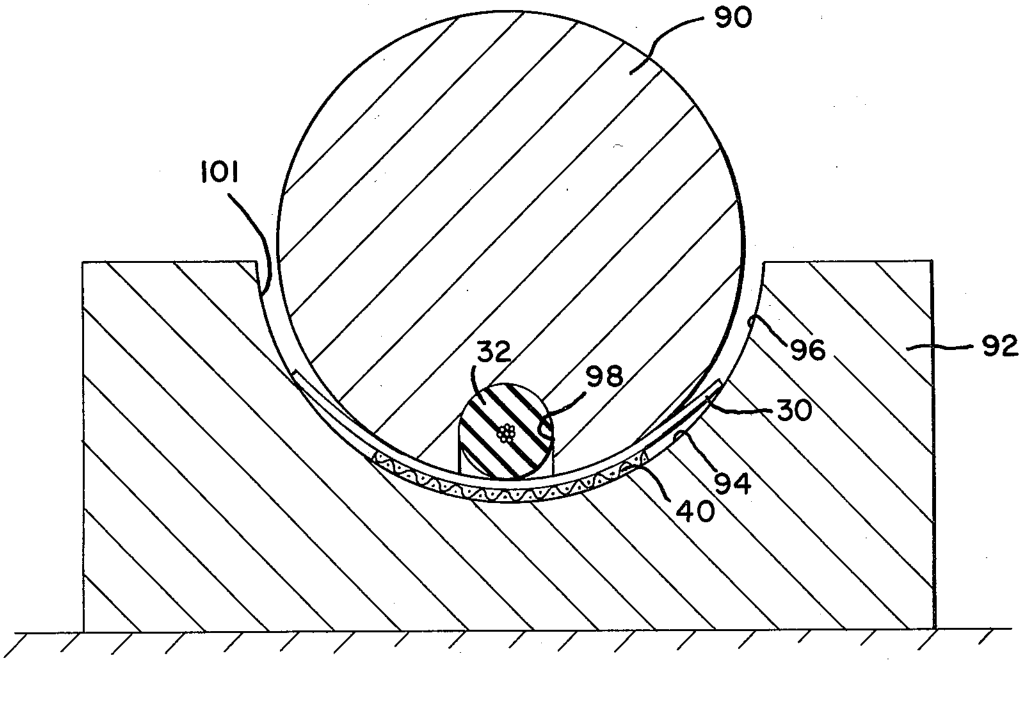
Figure 15:
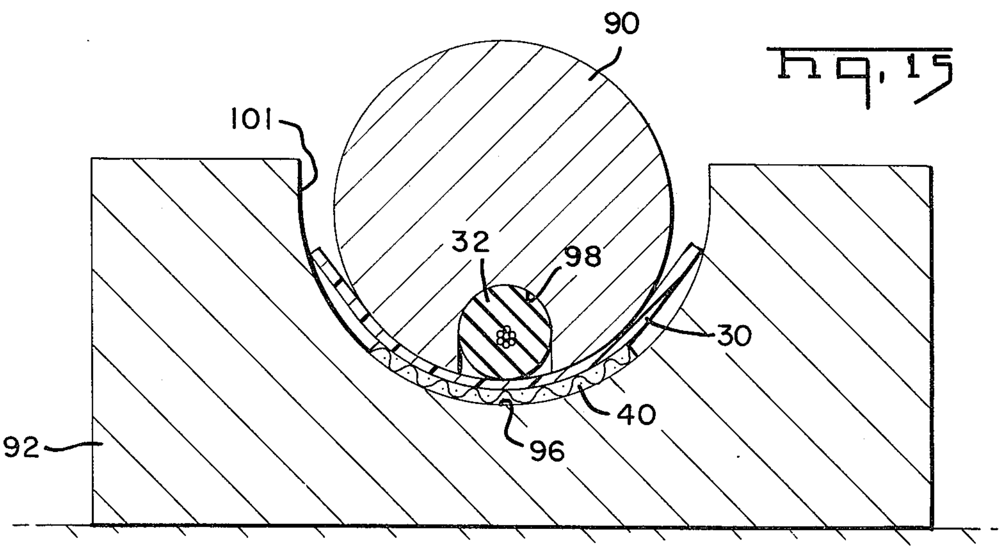
Figure 16:
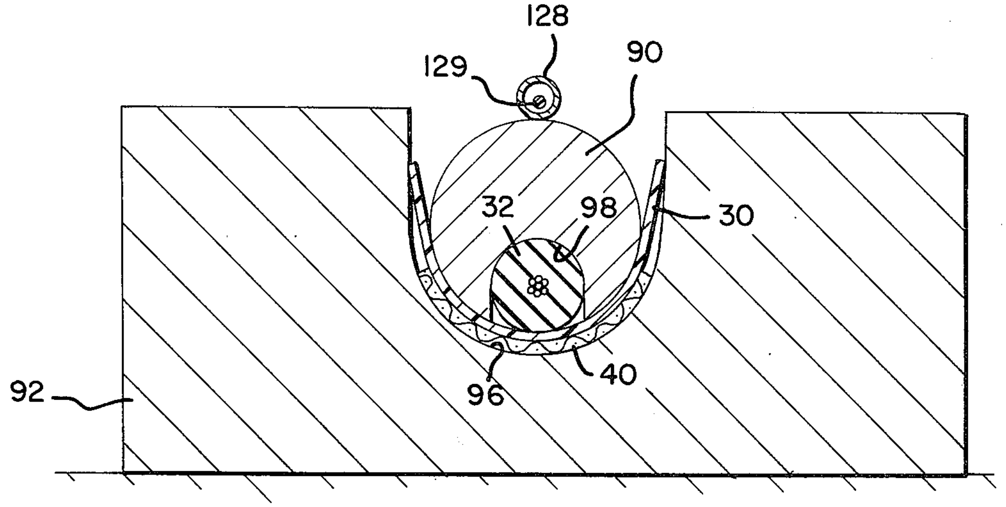

FIGS. 9–20 show a preferred form of apparatus for carrying out the manufacturing method described above. This apparatus comprises a base plate or support surface 36 having a central portion 38 in which the foiling and bonding operations are carried out. The circuit material 30 is advances through this central portion and to the lefthand end of the apparatus by an endless feed belt 40 which may be of a fiber glass coated with polytetrafluoroethylene and which has a width, as shown in FIG. 13, which is less than the width of the circuit material. This belt 40 travels over the upper surface of the central portion 38 of the base plate and downwardly through an opening 48, over a rubber drive wheel 50 which is mounted on a driven shaft 53. A suitable drive means is provided for this shaft to drive it at a constant speed which should be changeable for different production rates. The belt is held against the surface of the drive wheel 50 by an idler wheel 52 which is tangent to the drive wheel on the right hand side thereof. From the idler 52, the belt travels across and beneath the central portion 38 of the base plate and over an idler 54 thence downwardly to an idler 56 and upwardly through a guide means 58 to a guide wheel 42 mounted on a shaft 44. The guide means 58 comprises two opposed plates having an accurately located recess extending therethrough so that the belt 40 will be precisely aligned with guide wheel 42 and will be accurately guided onto the upper surface of the base plate through the opening 46 as shown in FIG. 12. None of the idlers 52, 54, 56, 42 are driven and the idlers 52 and 54 are mounted on levers 60, 66 which are pivoted at 62 and 68. The lever 60 is resiliently biased in a counterclockwise direction by a spring 64 attached to its lower end so that the idler 52 will be maintained against the surface of the drive wheel 50. The lever 66 is biased in a clockwise direction by a spring 70 attached to its lower end so as to maintain the proper tension in the belt.

The elastic body material 32 and the continuous strip 30 of flexible circuit are fed from suitable reels, not specifically shown, into a mandrel and forming die assembly 90, 92 (FIGS. 11–16) through a folding section generally indicated at 76 in which the strand of bonding material 34 is fed towards the body material, this strand being fed by feed wheels 72, 74 one of which is driven. From the folding section 76, the circuit material and body material are carried by the circuit through a bonding section 78 and through a cooling section 80 at the end of which the belt leaves the assembled body material and circuit material and travels over the drive wheel 50. The continuous length of assembled body material and circuit material is then fed through a guide 124 to a cutter 126 which cuts the individual connectors as illustrated.

Circuit material 30 and body material 32 are guided towards each other and towards the left as viewed in FIG. 9B by an entry guide 82 having a channel-like depression on its upper surface over which the circuit material travels. The lefthand end 86 of this guide extends beneath the righthand end of the mandrel 90 and the underside 88 of this lefthand end is cutaway to provide a guide surface for the belt 40 so that the belt will travel along a previously defined path towards the forming die 92.

Referring now to FIGS. 13–16, forming die 92 has an upwardly sloping guide surface 100 on its righthand end which intersects a generally conical recess 101 which extends leftwardly into the forming die. This conical surface merges with the short uniform channel portion 102 on the lefthand end of the die (See FIG. 11) so that the belt and the circuit material are gradually folded upwardly as illustrated in FIGS. 13–17 until the marginal side portions of the circuit extend substantially parallel to each other and upwardly above the elastic body material. As shown in FIG. 13, an accurately located flat guide surface 94 for the belt 40 is provided adjacent to the righthand and end of the entire so that the belt will be precisely positioned and the circuit material is similar accurately located by surface portions 96 in the guide surface of the die. The mandrel 90 is generally conical and fits in the die and on its underside, it has a recess 98 for the body material 32. This recess has a cylindrical surface at its inner end which conforms to the body material and the sidewalls which extend from this inner end are substantially parallel, the depth of the recess and the location thereof being such that the body material is accurately centered with reference to the circuit material where the two are brought together. As the belt 40 travels through the forming die, it carries with it the circuit material 30 and the body material 32 and the circuit is gradually folded as previously noted and as illustrated. The bonding material is fed towards the body material by a guide tube 128 having its end 129 located adjacent to the outlet end or the lefthand end of the mandrel 90.

Figure 17:
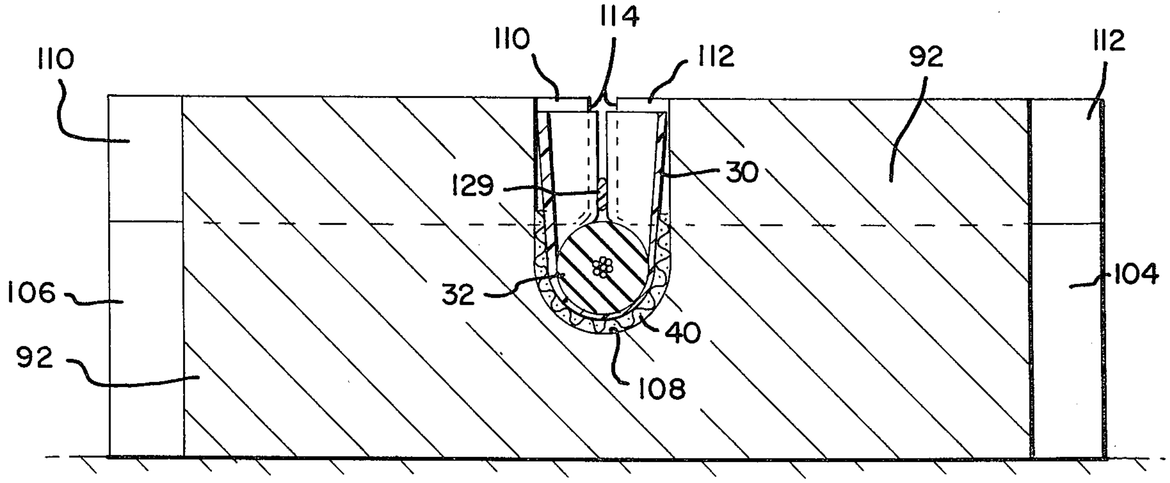

It will thus be apparent that at the lefthand end of the forming die 92, the circuit material will have been wrapped around the body material and the bonding material will be between the opposed surfaces of the circuit material and centrally above the bonding material as shown in FIG. 17. The body material and circuit material then move through lower guide block means comprising two side by side blocks 104, 106 having to recess in their abutting surfaces to provide a continuous guide surface 108 in which the circuit and body material are further guided and in which the marginal portions of the circuit material are moved adjacent to each other. To accomplish closing of the gap between the marginal portions of the circuit material, upper guide blocks 110, 112 are mounted on the lower guide blocks 104, 106 and the opposed surfaces of these upper blocks are spaced apart to leave a narrow gap 114. The surfaces are tapered so that this gap is progressively made more narrow as the circuit and body material are carried towards and through the guide means shown in FIG. 19. The guide blocks 104, 106 still provide the surface 108 but the upper guide blocks are replaced by a heater block 116, 118 which contain suitable resistance heating elements so that their opposite surfaces on each side of the gap 120 will cause the bonding material to bond the marginal portions of the circuit 30 to each other. From the heater station, the assembly travels through the lefthand portions of the guide blocks 104, 106 and through cooling blocks 120, 122 which may be similar to the heating blocks but which are not heated. When the assembly leaves the cooling blocks, the bonding material will have solidified and the assembly is self-supporting so that the belt is no longer required. The continuous length of assembled body material and circuit material travels through previously identified guide 124 and through the cutter 126 comprising blades which travel through a slot in the guide 124. The individual connectors are thus cut from the continuous length. The cutter may be of the general type commonly used in cigarette manufacturing machines.

It will be apparent from the foregoing that the circuit material and the body material are transported into and through the folding and bonding sections of the apparatus by the belt which engages only the circuit material. The left hand portion of the assembly as viewed in FIG. 9 is pushed from the feed wheel so 50 will go through the guide means 124 and the cutter by the trailing section which is being advanced by the belt.

Changes in construction will occur to those skilled in the art and various apparently different modifications and embodiments may be made without departing from the scope of the invention. The matter set forth in the foregoing description and accompanying drawings is offered by way of illustration only.

What is claimed is:

1. An electrical connecting means for connecting conductors on a first substrate to conductors on a second substrate, said substrates being in parallel spaced-apart relationship to each other, said connecting means comprising:

a generally cylindrical relatively elongated connector body of elastomeric material, said body being of a material of the class known as elastomers, an elastomer being characterized by the fact that it will stretch under a low stress to at least twice its length and will snap back to its original length on release of the stress, said connector body having an axially extending central core of non-yielding material extending therethrough, said elastomeric material being bonded to said core, a flexible circuit comprising a thin film of non-yieldable insulating material, said film having a width which is greater than the circumference of said connector body and having on one surface thereof a row of closely-spaced straight line conductors, said conductors having a uniform length, said uniform length being less than the width of said film whereby portions of said film on each side of said row are devoid of said conductors, said flexible circuit being wrapped around said connector body with said row of conductors facing away from said body whereby said body has on its surface parallel spaced-apart conductors which extend therearound, said marginal side portions having there surfaces against, and bonded to, each other.

2. An electrical connecting means as set forth in claim 1, said flexible circuit comprising a relatively rigid polyimid-amide film.

3. An electrical connecting means as set forth in claim 2 and second electrical connecting means, said second electrical means being substantially identical to said connecting means, said connecting means and said second connecting means being in side-by-side spaced-apart parallel relationship, and joining means extending between said connecting means and said second connecting means.

4. An electrical connecting means for connecting conductors on a first substrate to conductors on a second substrate, said substrates being in parallel spaced-apart relationship to each other, said connecting means comprising:

a generally cylindrical relatively elongated connector body, said body being of a material of the class know as elastomers, an elastomer being characterized by the fact that it will stretch under a low stress to at least twice its length and will snap back to its original length on release of the stress, a flexible circuit comprising a thin film of non-yieldable insulating material, said film having a width which is greater than the circumference of said connector body and having on one surface thereof a row of closely-spaced straight line conductors extending across the surface thereof and between the side edges thereof, said flexible circuit being wrapped around said connector body with said row of conductors facing away from said body whereby said body has on its surface parallel spaced-apart conductors which extend therearound, said film having marginal side portions which have surface portions thereof against, and bonded to, each other, said marginal side portions of said film extending radially away from said connector body thereby to provide an orienting tab, whereby upon positioning said connecting means between said substrates and compressing said connecting means between said substrates, said connector body is elastically deformed and said conductors on said filing are urged against said conductors on said substrates.

5. An electrical connecting means as set forth in claim 1 in combination with said substrates, said connecting means being compressed between said substrates, said conductors on said film being in electrical contact with said conductors on said substrates.

* * * * *